United States Patent
Yoon et al.

(10) Patent No.: US 10,058,951 B2
(45) Date of Patent: Aug. 28, 2018

(54) ALLOY FORMATION CONTROL OF TRANSIENT LIQUID PHASE BONDING

(75) Inventors: Sang Won Yoon, Ann Arbor, MI (US); Koji Shiozaki, Ann Arbor, MI (US)

(73) Assignee: TOYOTA MOTOR ENGINEERING & MANUFACTURING NORTH AMERICA, INC., Plano, TX (US)

(*) Notice: Subject to any disclaimer, the term of this patent is extended or adjusted under 35 U.S.C. 154(b) by 488 days.

(21) Appl. No.: 13/448,632

(22) Filed: Apr. 17, 2012

(65) Prior Publication Data

US 2013/0270326 A1  Oct. 17, 2013

(51) Int. Cl.
*B23K 20/02* (2006.01)
*B23K 20/16* (2006.01)
*H01L 23/00* (2006.01)
*B23K 101/36* (2006.01)

(52) U.S. Cl.
CPC .............. *B23K 20/02* (2013.01); *B23K 20/16* (2013.01); *H01L 24/83* (2013.01); *B23K 2201/36* (2013.01); *H01L 2224/83* (2013.01)

(58) Field of Classification Search
CPC ................................ B23K 20/02; B23K 20/16
USPC ........................ 228/153, 171, 173.3, 193–195
See application file for complete search history.

(56) References Cited

U.S. PATENT DOCUMENTS

| | | | |
|---|---|---|---|
| 2,490,548 A * | 12/1949 | Schultz | .................. B21H 8/005 148/531 |
| 4,551,904 A | 11/1985 | Berenz et al. | |
| 5,113,145 A | 5/1992 | Ideler et al. | |
| 5,152,695 A | 10/1992 | Grabbe et al. | |
| 5,166,774 A | 11/1992 | Banerji et al. | |
| 5,225,633 A | 7/1993 | Wigginton | |
| 5,234,152 A | 8/1993 | Glaeser | |
| 5,280,139 A | 1/1994 | Suppelsa et al. | |
| 5,289,967 A | 3/1994 | Bampton et al. | |
| 5,372,298 A * | 12/1994 | Glaeser | ................ B23K 20/023 228/121 |
| 5,381,944 A | 1/1995 | Makowiecki et al. | |
| 5,402,926 A | 4/1995 | Takeuchi et al. | |

(Continued)

FOREIGN PATENT DOCUMENTS

DE  102009050426  3/2011
JP  2004-165186  6/2004

(Continued)

OTHER PUBLICATIONS

MacDonald et al., "Transient Liquid Phase Bonding Processes", 1992, The Minerals, Metals & Materials Society, pp. 93-100.*

(Continued)

*Primary Examiner* — Kevin E Yoon
*Assistant Examiner* — Jacky Yuen
(74) *Attorney, Agent, or Firm* — Snell & Wilmer LLP

(57) ABSTRACT

A bonding structure enabling fast and reliable methods to fabricate a substantially homogeneous bondline with reduced dependency of a thickness limitation is disclosed. Also, this system creates a bondline targeted for performance in power electronics. This system is highly adaptable as various structures and fabrication options may be implemented. This enables diverse fabrication selection and creates less dependency on outside conditions. The disclosed system is at least applicable to wafer-to-wafer, die-to-wafer, die-to-substrate, or die-to-die bonding.

13 Claims, 9 Drawing Sheets

(56) References Cited

U.S. PATENT DOCUMENTS

| | | | |
|---|---|---|---|
| 5,416,429 A | 5/1995 | McQuade et al. | |
| 5,432,998 A | 7/1995 | Galasco et al. | |
| 5,542,602 A * | 8/1996 | Gaynes et al. | 228/175 |
| 5,613,861 A | 3/1997 | Smith et al. | |
| 5,821,827 A | 10/1998 | Mohwinkel et al. | |
| 5,830,289 A | 11/1998 | El-Soudani | |
| 5,836,075 A | 11/1998 | Fitzgerald et al. | |
| 5,847,572 A | 12/1998 | Iwasaki et al. | |
| 5,910,341 A | 6/1999 | Fey et al. | |
| 5,935,430 A | 8/1999 | Craig | |
| 5,997,708 A | 12/1999 | Craig | |
| 6,098,871 A | 8/2000 | Cairo et al. | |
| 6,199,751 B1 | 3/2001 | Gaynes et al. | |
| 6,257,481 B1 | 7/2001 | Shirzadi-Ghoshouni et al. | |
| 6,303,992 B1 | 10/2001 | Van Pham et al. | |
| 6,330,164 B1 | 12/2001 | Khandros et al. | |
| 6,444,921 B1 | 9/2002 | Wang et al. | |
| 6,529,022 B2 | 3/2003 | Pierce | |
| 6,547,124 B2 * | 4/2003 | Shah et al. | 228/246 |
| 6,602,053 B2 | 8/2003 | Subramanian et al. | |
| 6,624,484 B2 | 9/2003 | Christensen | |
| 6,669,489 B1 | 12/2003 | Dozier et al. | |
| 6,790,684 B2 | 9/2004 | Ahn et al. | |
| 6,836,011 B2 | 12/2004 | Azuma | |
| 6,845,901 B2 | 1/2005 | Koopmans | |
| 6,864,588 B2 | 3/2005 | Hung | |
| 6,937,037 B2 | 8/2005 | Eldridge et al. | |
| 6,958,531 B2 | 10/2005 | Ucok et al. | |
| 6,975,518 B2 | 12/2005 | Frutschy et al. | |
| 6,992,520 B1 | 1/2006 | Herbert | |
| 7,002,249 B2 | 2/2006 | Duffy et al. | |
| 7,049,693 B2 | 5/2006 | Canella | |
| 7,120,999 B2 | 10/2006 | Canella | |
| 7,165,712 B2 | 1/2007 | Abdo et al. | |
| 7,245,137 B2 | 7/2007 | Eldridge et al. | |
| 7,259,625 B2 | 8/2007 | Sanderson | |
| 7,279,788 B2 | 10/2007 | Canella | |
| 7,297,989 B2 | 11/2007 | Otani et al. | |
| 7,301,358 B2 | 11/2007 | Jovanovic et al. | |
| 7,335,931 B2 | 2/2008 | Alm | |
| 7,396,236 B2 | 7/2008 | Eldridge et al. | |
| 7,451,907 B2 | 11/2008 | Sigler et al. | |
| 7,495,877 B2 | 2/2009 | Havanur | |
| 7,511,521 B2 | 3/2009 | Richmond, II et al. | |
| 7,527,090 B2 | 5/2009 | Dani et al. | |
| 7,541,681 B2 | 6/2009 | Otremba | |
| 7,579,848 B2 | 8/2009 | Bottoms et al. | |
| 7,583,101 B2 | 9/2009 | Miller | |
| 7,612,456 B2 | 11/2009 | Fujii et al. | |
| 7,628,309 B1 | 12/2009 | Eriksen et al. | |
| 7,659,614 B2 | 2/2010 | Mehrotra | |
| 7,867,563 B2 | 1/2011 | Arase et al. | |
| 8,076,696 B2 | 12/2011 | Beaupre et al. | |
| 8,168,490 B2 | 5/2012 | Hebert | |
| 2002/0092895 A1 | 7/2002 | Blackshear et al. | |
| 2002/0110008 A1 | 8/2002 | Miyazaki et al. | |
| 2003/0099097 A1 | 5/2003 | Mok et al. | |
| 2003/0173499 A1 | 9/2003 | Cole et al. | |
| 2004/0058470 A1 | 3/2004 | Canella | |
| 2004/0072456 A1 | 4/2004 | Dozier et al. | |
| 2004/0183207 A1 | 9/2004 | Jeung et al. | |
| 2004/0262742 A1 | 12/2004 | DiStefano et al. | |
| 2005/0026351 A1 | 2/2005 | Farrar | |
| 2005/0035347 A1 | 2/2005 | Khandros et al. | |
| 2005/0257877 A1 | 11/2005 | Stark | |
| 2006/0071056 A1 | 4/2006 | Das | |
| 2006/0283921 A1 * | 12/2006 | Ciona | B23K 20/028 228/246 |
| 2007/0075422 A1 | 4/2007 | Fujii et al. | |
| 2007/0144841 A1 | 6/2007 | Chong et al. | |
| 2007/0152026 A1 | 7/2007 | Suh et al. | |
| 2007/0259539 A1 | 11/2007 | Brown et al. | |
| 2007/0269997 A1 | 11/2007 | Eldridge et al. | |
| 2008/0003777 A1 | 1/2008 | Slater et al. | |
| 2008/0061808 A1 | 3/2008 | Mok et al. | |
| 2008/0073665 A1 | 3/2008 | Slater et al. | |
| 2008/0090429 A1 | 4/2008 | Mok et al. | |
| 2008/0156475 A1 | 7/2008 | Suh | |
| 2008/0157799 A1 | 7/2008 | Gritters et al. | |
| 2008/0185713 A1 | 8/2008 | Dani et al. | |
| 2008/0210971 A1 | 9/2008 | Donofrio et al. | |
| 2008/0213612 A1 * | 9/2008 | Starikov et al. | 428/573 |
| 2008/0253098 A1 | 10/2008 | Liu | |
| 2009/0085191 A1 | 4/2009 | Najafi et al. | |
| 2009/0142707 A1 | 6/2009 | Eldridge et al. | |
| 2009/0153165 A1 | 6/2009 | Chong et al. | |
| 2009/0242121 A1 | 10/2009 | Suh | |
| 2010/0072555 A1 * | 3/2010 | Meng | H01L 21/187 257/369 |
| 2010/0183896 A1 | 7/2010 | Liu et al. | |
| 2011/0009979 A1 | 1/2011 | Shaw et al. | |
| 2011/0163445 A1 | 7/2011 | Chakrapani et al. | |
| 2011/0180777 A1 | 7/2011 | Afzali-Ardakani et al. | |
| 2011/0192024 A1 * | 8/2011 | Allen | B23P 15/04 29/889.721 |
| 2011/0240717 A1 | 10/2011 | Song et al. | |
| 2012/0112201 A1 * | 5/2012 | Otsuka et al. | 257/76 |

FOREIGN PATENT DOCUMENTS

| | | |
|---|---|---|
| JP | 2007-032465 | 2/2007 |
| JP | 2007-189154 | 7/2007 |
| JP | 2007-287927 | 11/2007 |
| JP | 2010-134082 | 6/2010 |

OTHER PUBLICATIONS

Bosco et al., "Critical interlayer thickness for transient liquid phase bonding in the Cu—Sn system", Acta Materialia 52, 2004, pp. 2965-2972.*

Chen et al., "Effect of Bonding Pressure on Transient Liquid Phase Bonding Joint Microstructure and Properties of T91/12Cr2MoWVTiB", available online Mar. 2, 2010, Advanced Materials Research vols. 97-101, pp. 107-110.*

Munding et al., Cu/Sn Solid-Liquid Interdiffusion Bonding, Wafer-Level 3d ICs Process Technology, 2008.*

Li et al ("Interfacial reaction in Cu/Sn/Cu system during the transient liquid phase soldering process", Nov. 18, 2010, Acta Materialia 59 (2011), pp. 1198-1211).*

Kang et al.; "Isothermal Solidification of Cu/Sn Diffusion Couples to Form thin-Solder Joints"; Journal of Electronic Materials; vol. 31, No. 11, 2002.

Guth et al.; "New Assembly and Interconnects Beyond Sintering Methods"; PCIM 2010; pp. 232-237; May 4-6, 2010.

Hille et al.; "Failure Mechanism and Improvement Potential of IGBT's Short Circuit Operation"; Proceedings of the 22$^{nd}$ International Symposium on Power Semiconductor Devices & ICs Hiroshima; pp. 33-36; 2010.

Zheng et al.; "Partial Transient Liquid-Phase Bonding of $Si_3N_4$ with Ti/Cu/Ni Muilti-Interlayers"; pp. 2026-2028; 1997.

Frederikse et al.; "Thermal and Electrical Properties of Copper-tin and Nickel-tin Intermetallics"; AIP Journal of Applied Physics; vol. 72, No. 1, pp. 2879-2882; Oct. 1, 1992.

Bontemps et al.; "Low Profile Power Module Combined with State of the Art MOSFET Switches and SiC Diodes Allows High Frequency and Very Compact Three-Phase Sinusoidal Input Rectifiers" Proc. of the Conf. for Power Electronics, Intellectual Motion and Power Quality; 6 pages; 2007.

Dodge; "Eliminating Parasitic Oscillation Between Parallel MOSFETs"; application Note APT-0402 Rev A; 6 pages, Mar. 25, 2004.

Rowden, et al.; "High Temperature SiC Power Module Packaging"; Proceedings of the ASME 2009 International Mechanical Engineering Congress & Exposition IMECE2009 Nov. 13-19.

Welch, III et al.; "Transfer of Metal MEMS Packages Using a Wafer-Level Solder Transfer Technique"; IEEE Transactions on Advanced Packaging; V. 28, No. 4; pp. 643-649; Nov. 2005.

(56) References Cited

OTHER PUBLICATIONS

Farruggia et al.; "Hybrid Modules as an Alternative to Paralleled Discrete Devices"; International Symposium on Microelectornics; vol. 4587; 399-404, Oct. 9, 2001.
Grossi; "Self Assembly of Die to Wafer Using Direct Bonding Methods and Capillary Techniques," 2007.
Hikasa, K.; "Development of Flexible Bumped Tape Interposer"; Furukawa Review; No. 24; pp. 59-64; 2003.
Mustain, et al.; "Transient Liquid Phase Die Attach for High-Temperature Silicon Carbide Power Devices"; IEEE Transactions on Components and Packaging Technologies; V. 33, No. 3; pp. 563-570; Sep. 2010.

* cited by examiner

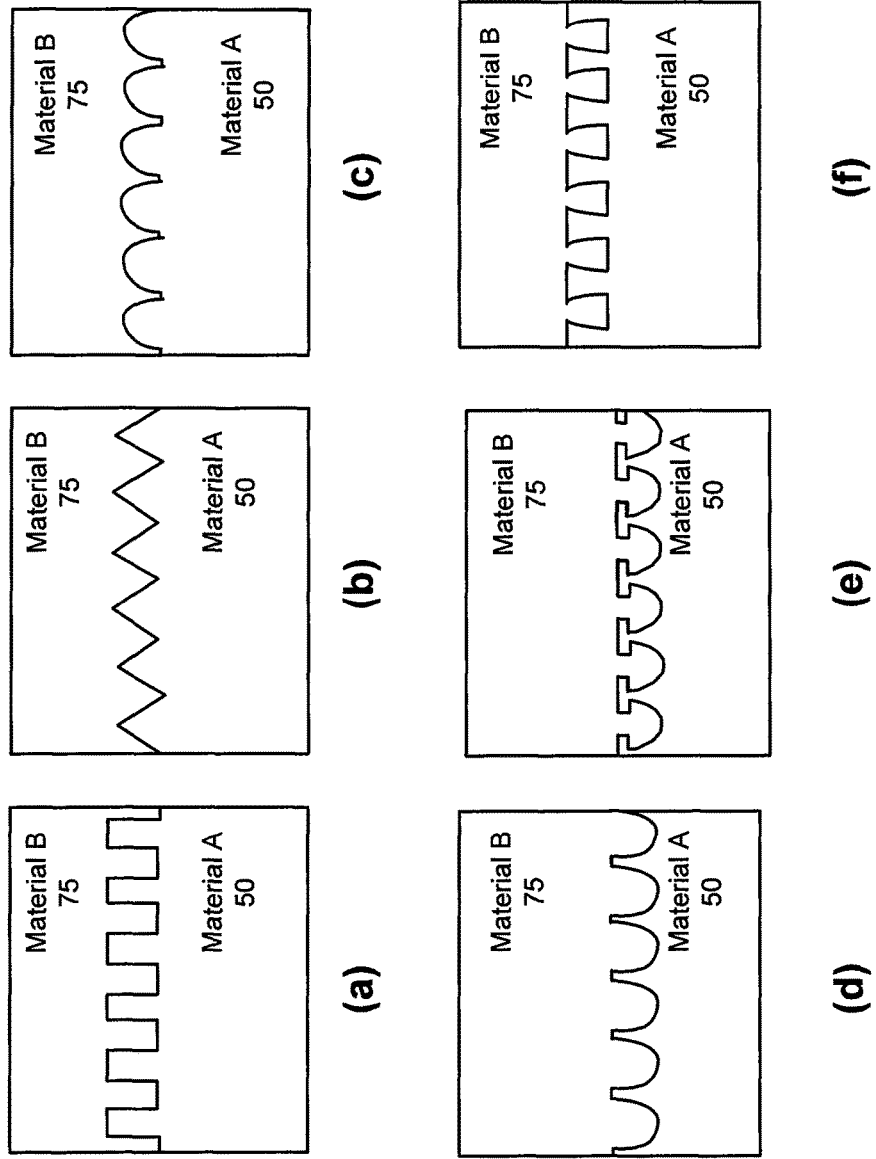
Figures 6(a)-(f)

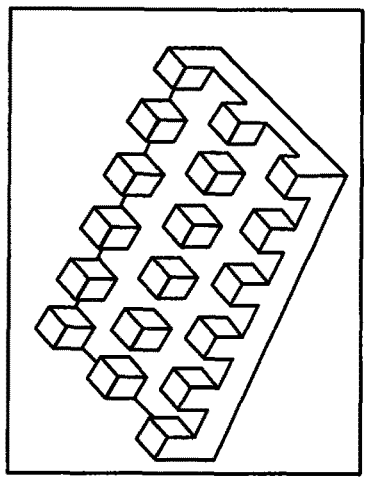
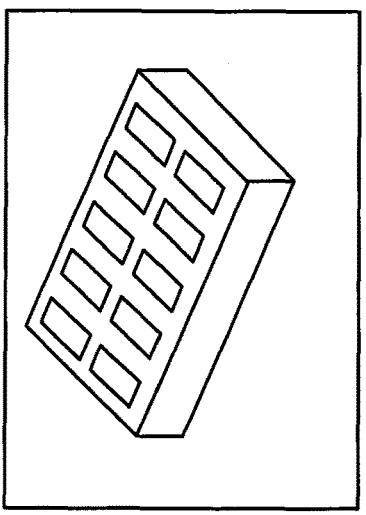
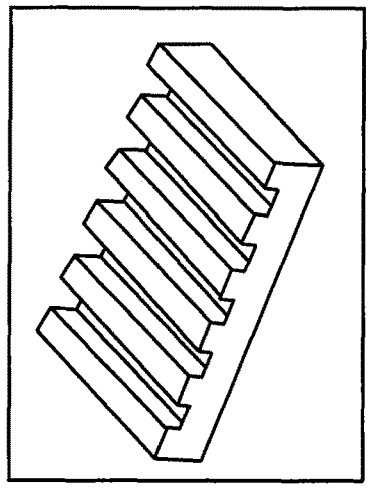
Figures 7(a)-(c)

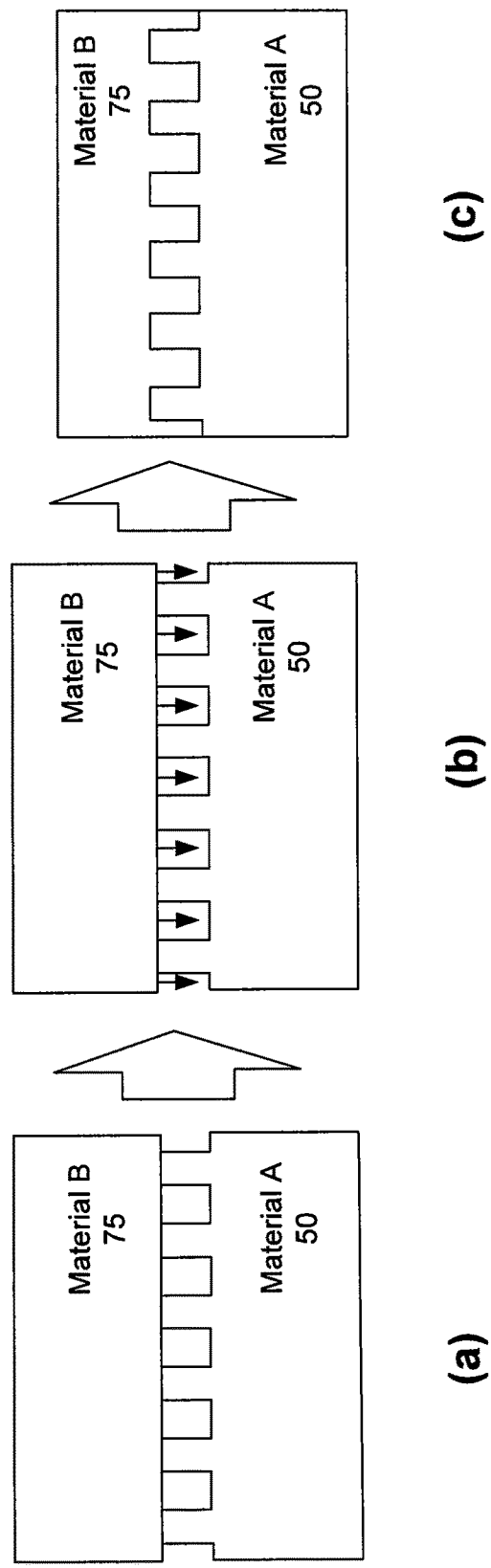
Figures 8(a)-(c)

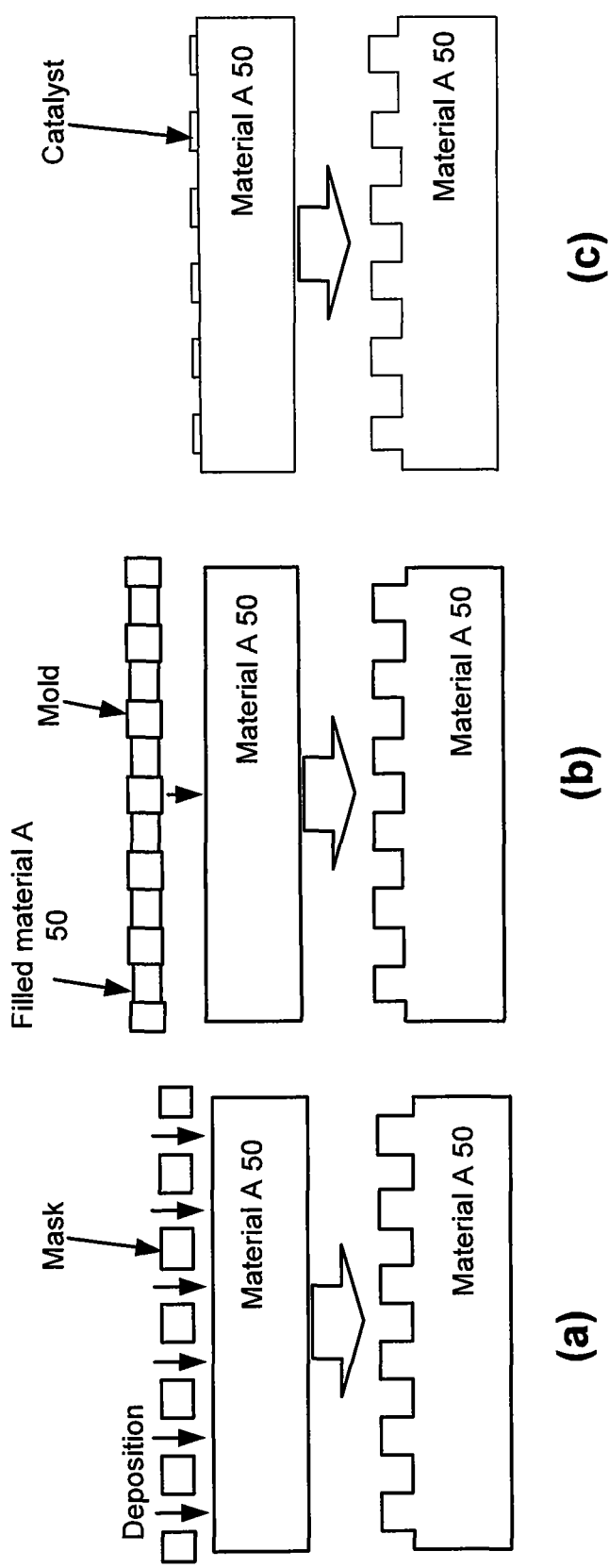
Figures 9(a)-(c)

ALLOY FORMATION CONTROL OF TRANSIENT LIQUID PHASE BONDING

FIELD OF THE INVENTION

The present disclosure relates to alloy formation, and more particularly, to alloy formation using transient liquid phase bonding in power electronics.

BACKGROUND

Various processes may be used to join materials together. Welding has been used in the automotive industries for years. Welding is the joining together of materials (typically metals or thermoplastics), usually by a fusion process. Design of complex components is often based on the concept of the "weakest link" limiting structural performance. The "ideal joint" would exhibit all of the characteristics of the bulk material comprising the structures being joined. Such a joint is by no means simple to produce.

The automobile fabrication process, and the elements and subsystems within, require highly reliable couplings available in relatively short production windows. Waiting hours for a bond to occur is not an option. An emphasis on the electrical properties of welds and the characteristics of the any alloys in the bond has not been a primary focus in the industry.

SUMMARY

The above needs are successfully met via the disclosed system and method. The present disclosure is generally directed to control of alloy formation via transient liquid phase bonding in power electronics. In various embodiments, a technology to improve bonding quality and fabrication reliability of bonding technologies for electronic devices is disclosed. This method is especially useful for bonding technologies generating multiple compounds (or alloys).

This disclosure describes a new bonding technique enabling fast and reliable fabrication of a substantially homogeneous bondline with reduced dependency of a thickness limitation. Stated another way, a substantially homogeneous bondline made of substantially a single alloy without a thickness limitation and excessive bonding time can be achieved using the techniques disclosed herein. A (more) suitable bondline providing better and targeted performance for power electronics may also be achieved. This system is highly adaptable as various structures and fabrication options may be implemented. This enables a diverse selection of fabrication techniques and creates less dependency on outside conditions. This process can be used over a wide field of applications. Moreover, for instance, this process can be used on any application associated with power electronics. For instance, this system is at least applicable to wafer-to-wafer, die-to-wafer, die-to-substrate, or die-to-die bonding. Moreover, this system is compatible with conventional fabrication techniques.

BRIEF DESCRIPTION OF THE DRAWINGS

The features and advantages of the embodiments of the present disclosure will become more apparent from the detailed description set forth below when taken in conjunction with the drawings. Naturally, the drawings and their associated descriptions illustrate example arrangements within the scope of the claims and do not limit the scope of the claims. Reference numbers are reused throughout the drawings to indicate correspondence between referenced elements.

FIGS. 6A-6F illustrate exemplary embodiments of two dimensional altered surface features of at least one of the materials;

FIGS. 7A-7C illustrate exemplary embodiments of three dimensional variations associated with the altered surface features;

FIGS. 8A-8C illustrate a reflow of one material into another material with surface features altered;

FIG. 9A illustrates an exemplary embodiment of a material deposition method;

FIG. 9B illustrates an exemplary embodiment of a pattern transfer deposition method; and FIG. 9C illustrates an exemplary embodiment of a growth via catalyst method.

DETAILED DESCRIPTION

In the following detailed description, numerous specific details are set forth to provide a understanding of the present disclosure. It will be apparent, however, to one ordinarily skilled in the art that elements of the present disclosure may be practiced without some of these specific details. In other instances, well-known structures and techniques have not been shown in detail to avoid unnecessarily obscuring the present disclosure.

The present disclosure is generally directed to control of alloy formation via transient liquid phase bonding in power electronics. Transient liquid phase (TLP) bonding produces joints that have microstructural and hence mechanical properties similar to those properties of the base materials. TLP bonding differs from diffusion bonding in which diffusion occurs when a melting point depressant element from an interlayer moves into lattice and grain boundaries of the substrates at the bonding temperature. Solid state diffusional processes lead to a change of composition at the bond interface and the dissimilar interlayer melts at a lower temperature than the parent materials. Thus, a thin layer of liquid spreads along the interface to form a joint at a lower temperature than the melting point of either of the parent materials. A reduction in bonding temperature leads to solidification of the melt, and this phase can subsequently be diffused away into the parent materials by holding at bonding temperature.

In various embodiments, a system and method 100 to improve bonding quality and fabrication reliability of bonding technologies for electronic devices is disclosed. This method 100 is especially useful for bonding technologies generating multiple compounds (or alloys).

Figure 1:
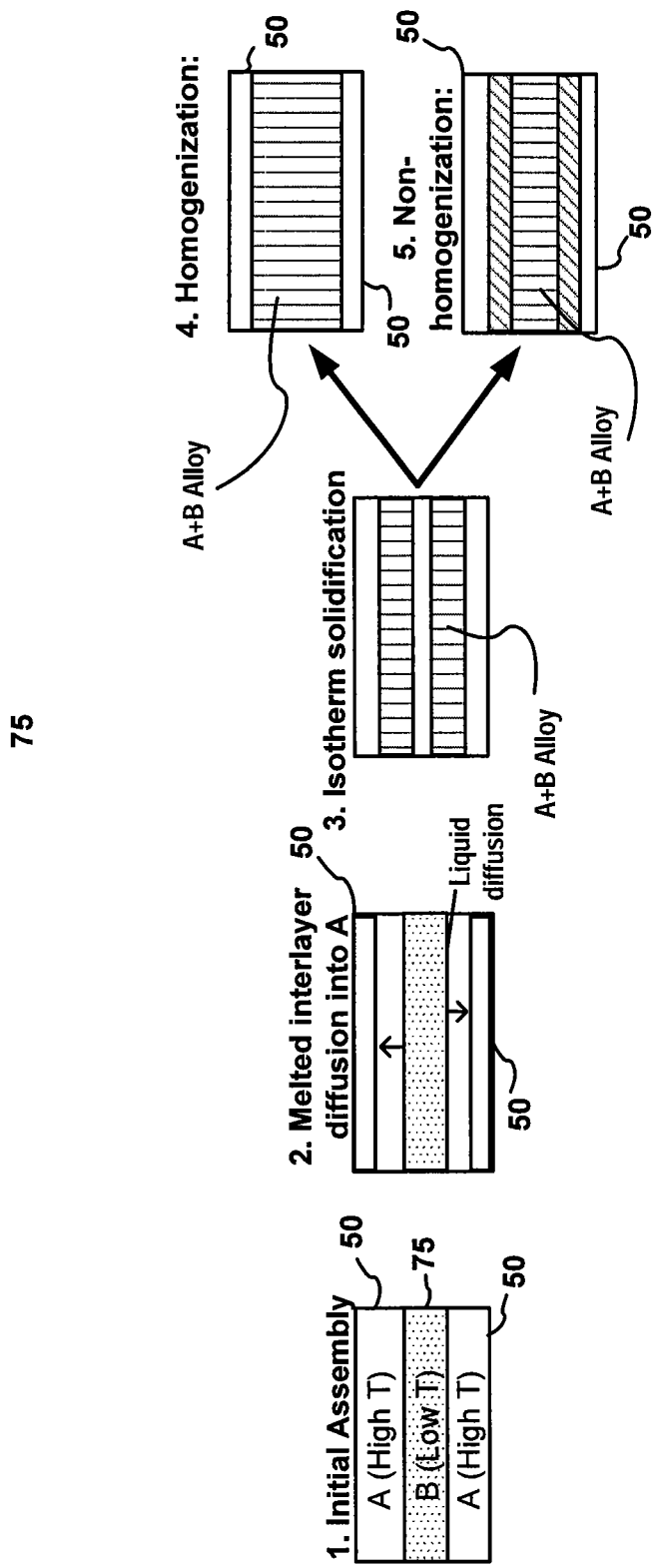
FIG. 1 depicts an exemplary embodiment of transient liquid phase bonding.

With reference to FIG. 1 according to various embodiments, the present method 100 utilizes transient liquid phase (TLP) bonding for electronics packaging. TLP bonding may be effective for high power semiconductor devices as during this process the remelting temperature (i.e., sustainable temperature) is significantly larger than the bonding temperature. TLP may be useful in may electronic devices, especially by high temperature power electronic devices, such as those made of silicon, SiC, GaN, etc.

An overview of TLP is illustrated in FIG. 1. In general, two (or multiple) materials are involved with TLP bonding. As depicted, two materials denoted as material A 50 (that has high melting temperature) and material B 75 (that has low melting temperature with respect to the melting temperature of material A 50). It should be appreciated that both material A 50 and material B 75 need not be pure in composition. As bonding temperature increases, the material B 75 begins to melt and diffuse into the material A 50, as shown at step 2 of FIG. 1. The diffused materials may sequentially react with the material B 75 and form an alloy via isothermal solidification. The solidification may continue until the bondline becomes a complete set of A+B alloy, such as depicted in step 4 of FIG. 1 (e.g., homogeneous bondline). Mechanical pressure (such as the range of several kPa to several MPa, such as from 3 kPa to 1 MPa) may applied during the TLP bonding process.

In some TLP materials, multiple A+B alloys may generate multiple compounds such as depicted in step 5 of FIG. 1 leading to the non-homogeneous bondline. This non-homogenous bondline is often considered to be non-ideal because of its non-uniformity, inconsistency, uncontrollability, and unpredictable quality, which may present problems for production. For example, copper-tin (Cu—Sn) are TLP materials that may generate multiple Cu—Sn compounds (or alloys). As both copper and tin are widely employed in power electronics materials, in various embodiments, the methods 100 of this disclosure are configured to minimize the non-homogeneous bondline generation.

In general, a particular alloy of the multiple available alloys may be more suitable for power electronics applications, due to the high power usage and high temperature generation of the power electronics, such as a conductive bondline. For example, the $Cu_3Sn$ alloy has higher electrical conductivity as compared to $Cu_6Sn_5$, even though both alloys are generated during Cu—Sn TLP bonding process ($Cu_3Sn$ corresponds to alloy B+ and $Cu_6Sn_5$ corresponds to alloy A+). Thus, for power electronics, a target may be to utilize a process to create a homogeneous bondline made of the preferred material (e.g., $Cu_3Sn$ alloy instead of $Cu_6Sn_5$). The above disclosed needs are successfully met via the disclosed system and method 100.

Figure 2:
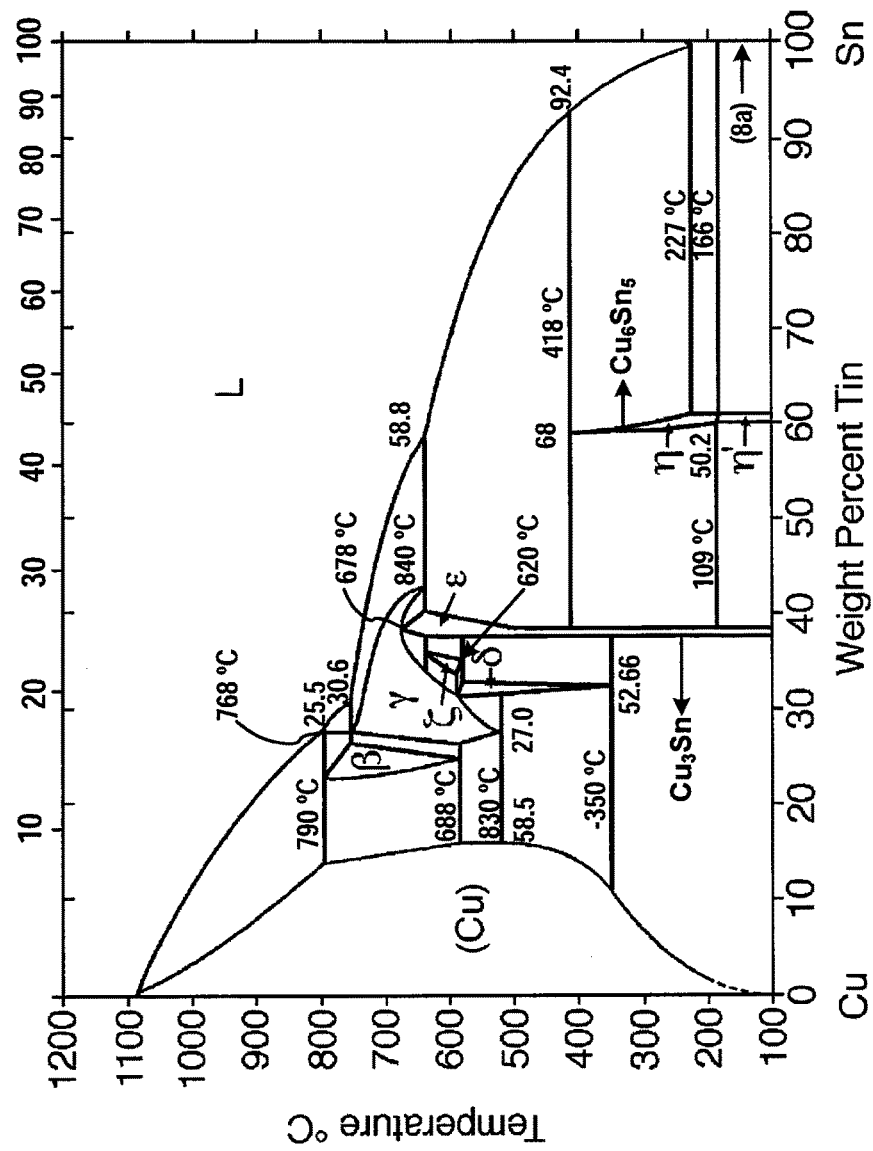
FIG. 2 depicts a phase diagram of Cu—Sn TLP bonding.
Figure 3:
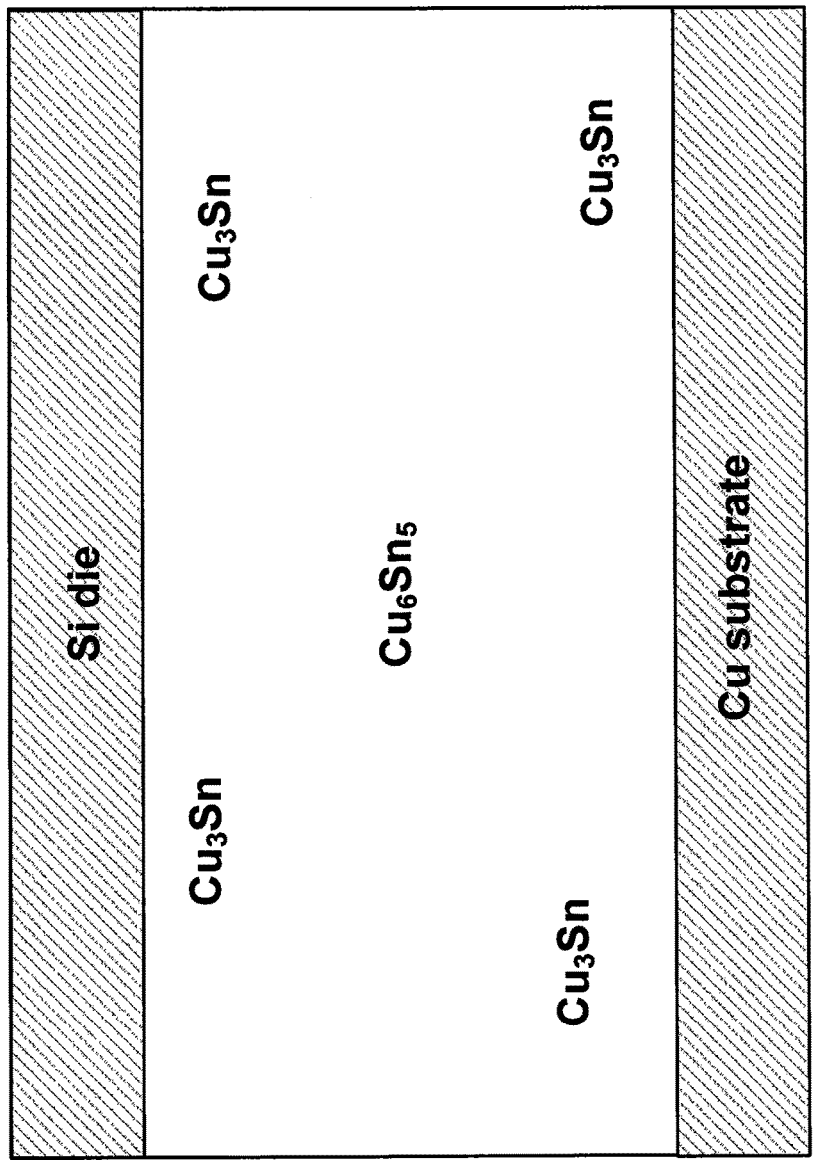
FIG. 3 depicts an example of Cu—Sn TLP bonding with non-homogeneous bondlines.

Copper-tin (Cu—Sn) TLP bonding has a complicated phase diagram (shown in FIG. 2) and may generate multiple composite formations. Among Cu—Sn composites (or alloys) in the figure, $Cu_3Sn$ and $Cu_6Sn_5$ are the most frequently observed in power electronics applications. Using previous methods, the two Cu—Sn alloys may co-exist in a bondline of die attachment of power electronics, (one example such bondline is shown in FIG. 3). The bondline shown in FIG. 3 is non-homogeneous (i.e., made of multiple materials) with an ambiguous shape. The $Cu_3Sn$ alloy may be surrounded by the $Cu_6Sn_5$ alloy (FIG. 3) or sandwiched by the alloy $Cu_6Sn_5$. Bondline quality is hard to control. Several methods to produce only a $Cu_3Sn$ bondline have been attempted. One is reducing the thickness of Sn and the other is extending bonding time. However, both methods have problems. The first method (thinner Sn layer) is able to fabricate only a thin bondline, such as 1-5 µm, which experience more stress when exposed to high temperature compared to thick bondline. The present method may produce a bondline not limited in size, such as from 1-30 µm, or from 5 µm to 50 µm. The high temperature-induced stress, which is a general challenge in power electronics, increases the chance of damage at the bondline and thus thinning Sn is a limited approach. The second method (longer bonding time) can achieve a thicker bondline but requires long process time, which is inadequate for mass production. These approaches and problems are not limited to Cu—Sn, which is used as an example herein, and can be observed in materials that have a complex phase diagram and generate multiple alloys. For example, table 1 below illustrates a non-exhaustive list of additional conventional bonding materials.

TABLE 1

| Material System | Bonding Process | Remelt Temp. |
|---|---|---|
| Copper - Tin | 4 min at 280° C. | >415° C. |
| Silver - Tin | 60 min at 250° C. | >600° C. |
| Silver - Indium | 120 min at 175° C. | >880° C. |
| Gold - Tin | 15 min at 260° C. | >278° C. |
| Gold - Indium | 0.5 min at 200° C. | >495° C. |
| Nickel - Tin | 6 min at 300° C. | >400° C. |

In various embodiments the present system 100 may be utilized to achieve a homogeneous bondline made of a single alloy. For instance, a single alloy may be achieved based on attributes targeted to power electronics applications. One example alloy is $Cu_3Sn$ which is more suitable in power electronics compared to other alloys, such as $Cu_6Sn_5$. The present system 100 may be configured to fabricate a thick bondline, which is advantageous in reducing bondline stress induced by high temperature. Also, aiding in mass production, the present system does not require long bonding time and is less depend on fabrication conditions. For instance, the bonding process of the present system 100 is between about 30 minutes to about 2 hours. The present system 100 provides excellent contact and good electrical and thermal conductivity to bonded devices, and therefore, improves device performance as well as bonding quality over prior techniques.

Multiple structures and fabrication options are proposed. Various materials may be used. Also, a pre-treatment of a material surface may be performed. This variety enables a flexible design and fabrication process and easy translation of this technology to many applications. For instance, this system and method 100 may be applied to wafer-to-wafer, die-to-wafer, die-to-substrate, or die-to-die bonding. Also, the presently disclosed technology 100 is compatible with conventional fabrication techniques.

Figure 4:
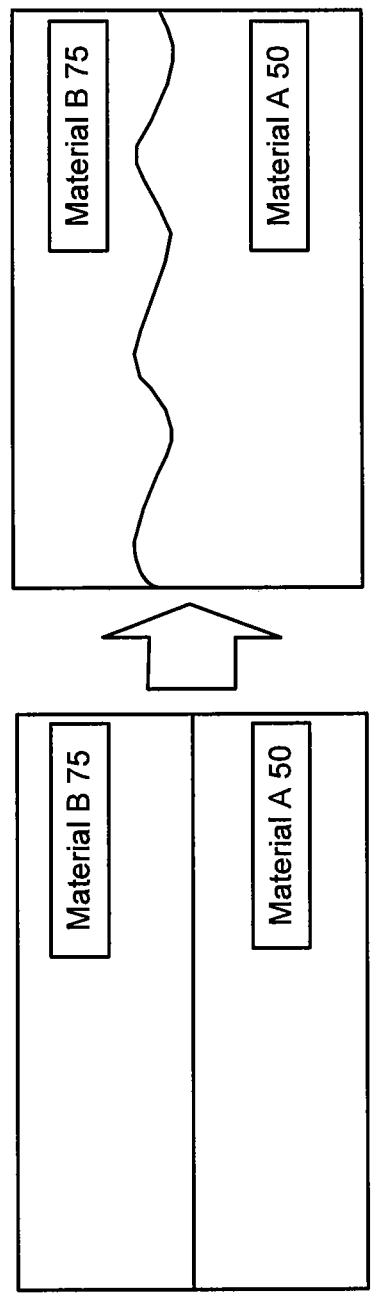
FIG. 4A illustrates an exemplary embodiment of TLP bonding without altering the surface properties of the materials.
FIG. 4B illustrates an exemplary embodiment of TLP bonding comprising altered surface properties of at least one of the materials.

With reference to FIGS. 4A and 4B, a conceptual view of an exemplary embodiment of the presently disclosed technology is depicted. As previously discussed, TLP may employ bonding two materials: material A 50 having a high melting temperature and material B 75 having a comparatively low melting temperature. The system 100 is configured to leverage the results of increasing the contact area between the two materials. The "wavy" surface (shown in FIG. 4B) increases the contact area more than 40% compared to the flat surface (shown in FIG. 4A). The altered surface properties, such as the wavy surface, may achieved using the processes and techniques recited herein. (See for example FIGS. 8-9).

A system 100 using a Cu—Sn is disclosed; however, an analogous method 100 can be used in other two-material TLP bonding that generates multiple alloys (such as those disclosed in table 1). For example the first material, material A 50 and the second material, material B 75, may comprise any of copper, tin, silver, indium, gold, nickel, and/or boron. The two most common alloys of Cu—Sn ($Cu_3Sn$ and $Cu_6Sn_5$) may be formed in following ways. First, Cu (material A 50) reacts with Sn (material B 75) and produces the first Cu—Sn alloy, $Cu_6Sn_5$. This $Cu_6Sn_5$ may react with left-over Cu 50 and form $Cu_3Sn$. Therefore, in various embodiments the $Cu_6Sn_5$ is configured to have increased contact with Cu 50, which expedites the reaction between the two materials and forms $Cu_3Sn$ more rapidly. Thus, a resultant uniform bondline of substantially only $Cu_3Sn$ may be achieved in shorter time compared to the flat surface (FIG. 4A).

Figure 5:
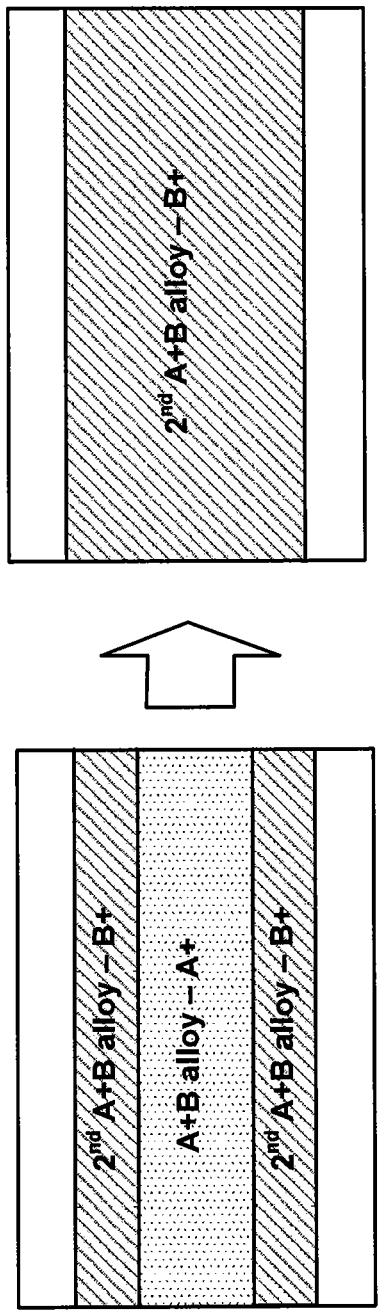
FIG. 5 illustrates an exemplary embodiment of a modified bondline.

This method 100 has another advantage other than fabricating a homogeneous bondline at relatively short time. In power electronics, a bondline proving high electrical conductivity is beneficial. $Cu_3Sn$ has higher electrical conductivity than $Cu_6Sn_5$ and thus is generally better suited for power electronics. Stated another way, the techniques disclosed herein create a bondline made of substantially only $Cu_3Sn$ without $Cu_6Sn_5$ which is well suited for power electronics applications. FIG. 5 illustrates the transition from the multiple-alloy bondline to a single alloy bondline with high suitability for power electronics. The methods 100 disclosed herein are at least applicable to automotive, watercraft aerospace, nuclear, and/or electronics industries. Additionally, the methods 100 disclosed herein are at least applicable to hybrid, plug-in hybrid, and/or electrical vehicles.

As previously disclosed, the wavy surface approach of FIG. 4B is just one permutation of the available altered surface properties. Altered surface properties may be any shape. For instance, altered surface properties could follow a geometric or non-geometric pattern and/or combinations thereof. The altered surface properties may be a regular or an inconsistent pattern. For instance, a non-exhaustive listing of variations is shown in FIGS. 6 and 7. FIG. 6 depicts 2D cross-section views of the variations. The wavy surface can be series of several structures including rectangular pillars or cylinders (FIG. 6A), pyramids or chopped channels, similar to axe marks (FIG. 6B), or round bumps (FIGS. 6C and 6D). It is also possible to make a Velcro like structure (FIGS. 6E and 6F) to enhance the interface strength between material A 50 and B 75 (and/or between material A 50 and alloy of material B 75 after the alloy formation).

The arrangement of the structures may also be varied. For instance, FIG. 7 illustrates such arrangement variations of the rectangular pillars shown in FIG. 6A. The arrangement includes array of slits (FIG. 7A), grid/plaid pattern (FIG. 7B), or array of pillars (FIG. 7C). Of course, other variations shown in FIG. 7 also have the arrangement variations. For instance, a random pattern or a combination of patterns such as a combination of FIGS. 7A-7C, and/or a combination of a random pattern and one of the regular patterns such as FIGS. 7A-7C.

In various embodiments, material B 75 may be sandwiched between two sections. These two sections may both be material A 50 or be made of material A and another material having altered surface features.

In various embodiments, material A 50 and/or material B 75 may have altered surface features. For instance, applying a surface feature such as a pattern to material A 50 (having a high melting temperature) without applying a surface feature, such as a pattern, to material B 75, may be convenient for fabrication. This is because the material B 75 will be melted during TLP bonding process (FIG. 1, step 2). Thus, the melted material B 75 (for example Sn) reflows into the valley of the patterned material A (for example Cu). FIG. 8 depicts this process in greater detail.

For example, during assembly (FIG. 8A, step 1 in FIG. 1), only material A 50 has altered surface features such as a pattern, whereas material B 75 does not have an substantially altered surface feature. In response to the bonding process starting, the material B melts and reflows into the holes or valleys of material A 50 (FIG. 8B, step 2). As the bonding proceeds, the reflowed material B 75 forms the large contact structure with material A 50 (FIG. 8C, step 3).

The altered surface properties, e.g., wavy surface and/or pattern, can be fabricated in numerous ways. For instance, the altered surface properties may be by (1) etching and/or (2) deposition. In general, etching is removing unwanted areas and deposition is adding wanted area. Etching can be achieved in multiple fashions. For instance, etching can be achieved by chemical etching (usage of liquid removing material A 50), dry etching (usage of gas or plasma removing material A 50), mechanical grinding or scribing, or high energy beam etching such as laser etching. Deposition can be achieved in multiple fashions. For example, deposition can be achieved by depositing additional material A 50 through a mask using electroplating, evaporating, or supporting; pattern transfer such as nano-pattern transfer or selective bonding of material A 50; or growth of material A 50. FIGS. 9A-9C depict these deposition methods. FIG. 9A illustrates the first deposition through a mask. FIG. 9B depicts pattern transfer using a mold and pre-filled material A. FIG. 9C illustrates a patterned catalyst for material A 50 and growth of material A 50 (or capture of material A 50).

This disclosure describes a new bonding system 100 enabling fast and reliable fabrication of a homogeneous bondline with reduced dependency of thickness limitation. This system 100 is highly adaptable as various structures and fabrication options may be implemented. This enables less dependency on fabrication conditions. This process can be used over a wide field of applications. For instance, this process 100 can be used on any application associated with power electronics. For instance, this system 100 is applicable to wafer-to-wafer, die-to-wafer, die-to-substrate, or die-to-die bonding. Moreover, this system 100 is compatible with conventional fabrication techniques.

Those of ordinary skill will appreciate that the various illustrative logical blocks and process steps described in connection with the examples disclosed herein may be implemented as electronic hardware, computer software, or combinations of both. Whether such functionality is implemented as hardware or software depends upon the particular application and design constraints imposed on the overall system. Ordinarily skilled artisans may implement the described functionality in varying ways for each particular application, but such implementation decisions should not be interpreted as causing a departure from the scope of the disclosed apparatus and methods.

The steps of a method or algorithm described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC).

The foregoing description of the disclosed example embodiments is provided to enable any person of ordinary skill in the art to make or use the present invention. Various modifications to these examples will be readily apparent to those of ordinary skill in the art, and the principles disclosed herein may be applied to other examples without departing from the spirit or scope of the present invention. The described embodiments are to be considered in all respects only as illustrative and not restrictive and the scope of the invention is, therefore, indicated by the following claims rather than by the foregoing description. All changes which come within the meaning and range of equivalency of the claims are to be embraced within their scope.

What is claimed is:

1. A transient liquid phase bonding method for alloy formation control for creating a highly conductive alloy incorporated in an automotive power electronic device, the method comprising:
   providing a first material made of copper (Cu) and having a first surface;
   etching within the first surface of the first material or adding additional material of the first material on the first surface of the first material to form a plurality of valleys and a plurality of hills having flared ends that increase a surface area of the first material, each hill of the plurality of hills being wider at an end of the hill than at a base of the hill;
   providing a second material made of tin (Sn) and having a second surface;
   etching within the second surface of the second material or adding additional material of the second material on the second surface of the second material to form a plurality of valleys and a plurality of hills having flared ends for interlocking with the plurality of hills and the plurality of valleys that were etched within or added on the first surface of the first material;
   interlocking the plurality of valleys and the plurality of hills that were etched within or added on the first surface of the first material with the plurality of hills and the plurality of valleys that were etched within or added on the second surface of the second material;
   melting the second material that is interlocked with the first material such that the second material reflows between the plurality of valleys and the plurality of hills of the first material to create partial liquid diffusion;
   reacting the partially diffused material with the second material via isothermal solidification; and
   creating a substantially homogenous bondline made of the highly conductive alloy to be incorporated in the automotive power electronic device.

2. The transient liquid phase bonding method of claim 1, further comprising applying between about 3 kPa to about 1 MPa of compressive force to the first material and the second material.

3. The transient liquid phase bonding method of claim 1, wherein the substantially homogenous bondline is between about 5 μm to about 50 μm.

4. The transient liquid phase bonding method of claim 1, wherein the additional material of the first material is added on the first surface of the first material or the additional material of the second material is added on the second surface to form the plurality of hills and the plurality of valleys on the first surface or the second surface, respectively.

5. The transient liquid phase bonding method of claim 4, wherein adding the additional material is achieved by at least one of material deposition, by pattern transfer, or by growth of material.

6. The transient liquid phase bonding method of claim 1, wherein the substantially homogeneous bondline is made of only a $Cu_3Sn$ alloy for increasing electrical conductivity in the automotive power electronic device.

7. The transient liquid phase bonding method of claim 1, further comprising varying the type of surface feature across the first surface of the first material in contact with the second surface of the second material.

8. The transient liquid phase bonding method of claim 1, wherein the first material or the second material is etched to form the plurality of valleys and the plurality of hills within the first surface or the second surface, respectively.

9. The transient liquid phase bonding method of claim 1, wherein the method is used for at least one of a hybrid, a plug-in hybrid, or an electrical vehicle.

10. A method, comprising:
    providing a first block or piece made of a first material and having a first surface;
    etching within the first surface of the first block or piece or adding additional material of the first material on the first surface of the first block or piece to form a plurality of bumps and a plurality of valleys on the first block or piece, the plurality of bumps having flared ends, each bump of the plurality of bumps being wider at an end of the bump than at a base of the bump;
    providing a second block or piece made of a second material and having a second surface;
    etching within the second surface of the second block or piece or adding material of the second material on the second surface of the second block or piece to form a plurality of valleys and a plurality of bumps on the second block or piece that correspond and interlock with the plurality of bumps and the plurality of valleys on the first block or piece, the plurality of bumps of the second block or piece having flared ends for interlocking with the corresponding plurality of valleys of the first block or piece;
    sandwichably positioning the second block or piece between the first block or piece and a third block or piece made of the first material;
    interlocking the plurality of bumps and the plurality of valleys that were etched within or added on the first surface of the first block or piece with the plurality of valleys and the plurality of bumps that were etched within or added on the second surface of the second block or piece for transient liquid phase bonding;
    applying heat to at least the second block or piece to reach a temperature equal to or greater than a bonding temperature of the second material for melting and diffusing the second block or piece, the heat being applied after the plurality of bumps and the plurality of valleys are etched within or added on the second block or piece; and
    creating a substantially homogenous bondline of an alloy material.

11. A method for creating a substantially homogenous bondline of a $Cu_3Sn$ alloy material having high conductivity and incorporated in an automotive power electronic device, the method comprising:

providing a first material made of copper (Cu) and having a first surface;
providing a second material made of tin (Sn) and having a second surface;
sandwichably positioning the second material between a first section of the first material and a second section of the first material;
etching within the first surface of the first section of the first material or adding additional material of the first material on the first surface of the first section of the first material to form a plurality of valleys and a plurality of hills having flared ends that increase a surface area of the first material, each hill of the plurality of hills being wider at an end of the hill that at a base of the hill;
etching within the second surface of the second material or adding additional material of the second material on the surface of the second material to form a plurality of valleys and a plurality of hills having flared ends for interlocking with the plurality of hills and the plurality of valleys that were etched within or added on the first surface of the first section of the first material;
melting the second material that is positioned between the plurality of valleys and the plurality of hills that were etched within or added on the first surface of the first section and the second section of the first material; and
via transient liquid phase bonding, creating a substantially homogenous bondline made of the $Cu_3Sn$ alloy that is configured to be electrically conductive and incorporated in an automotive power electronic device.

12. The method of claim 10, wherein adding the additional material of the first material on the first surface of the first block or piece includes:
positioning, over the first block or piece, a plurality of molds having a plurality of openings filled with the first material; and
removing the plurality of molds to form the plurality of bumps on the first block or piece and the plurality of valleys on the first block or piece,
wherein the plurality of valleys on the first block or piece have a substantially flat bottom surface for allowing the second material to diffuse into the plurality of valleys to increase a contact surface with the first material for enhancing the creation of the substantially homogeneous bondline.

13. The method of claim 10, wherein the substantially homogeneous bondline is made of only a $Cu_3Sn$ alloy for increasing electrical conductivity in an automotive power electronic device.

* * * * *